United States Patent
Izumo et al.

(10) Patent No.: US 9,917,330 B2
(45) Date of Patent: Mar. 13, 2018

(54) SECONDARY BATTERY

(71) Applicants: KABUSHIKI KAISHA NIHON MICRONICS, Tokyo (JP); GUALA TECHNOLOGY CO., LTD., Hyogo-Ken (JP)

(72) Inventors: Shozo Izumo, Tokyo (JP); Tomokazu Saito, Tokyo (JP); Akira Nakazawa, Hyogo-Ken (JP)

(73) Assignees: KABUSHIKI KAISHA NIHON MICRONICS, Tokyo (JP); GUALA TECHNOLOGY CO., LTD., Hyogo-Ken (JP)

( * ) Notice: Subject to any disclaimer, the term of this patent is extended or adjusted under 35 U.S.C. 154(b) by 0 days.

(21) Appl. No.: 15/024,467

(22) PCT Filed: Dec. 10, 2013

(86) PCT No.: PCT/JP2013/083063
§ 371 (c)(1),
(2) Date: Mar. 24, 2016

(87) PCT Pub. No.: WO2015/087388
PCT Pub. Date: Jun. 18, 2015

(65) Prior Publication Data
US 2016/0276711 A1    Sep. 22, 2016

(51) Int. Cl.
*H01M 10/0585* (2010.01)
*H01M 10/052* (2010.01)
(Continued)

(52) U.S. Cl.
CPC .............. *H01M 10/0585* (2013.01); *H01L 31/022425* (2013.01); *H01L 49/00* (2013.01);
(Continued)

(58) Field of Classification Search
CPC ......... H01M 10/0585; H01M 10/0525; H01M 10/30; H01M 10/0436; H01M 10/0413;
(Continued)

(56) References Cited

U.S. PATENT DOCUMENTS

| 4,022,952 A | * | 5/1977 | Fritts | H01M 4/02 204/268 |
| 2010/0067089 A1 | | 3/2010 | Nakazawa | |
| 2013/0224596 A1 | * | 8/2013 | Nakazawa | H01M 14/005 429/220 |

FOREIGN PATENT DOCUMENTS

JP    2009-140707 A    6/2009
WO   WO2008 053561 A1  5/2008
(Continued)

OTHER PUBLICATIONS

Literature: Battery Handbook, Edited by the Committee of Battery Technology in Electrochemical Society of Japan: "Nickel-Metal Hydride Battery" Chapter VI, Part VI; p. 319.

*Primary Examiner* — Cynthia K Walls
(74) *Attorney, Agent, or Firm* — Acon & Thomas, PLLC (57) ABSTRACT

Provided is a secondary battery being superior to a conventional secondary battery with respect to volume (energy density) and manufacturing (manufacturing workload). The present invention provides a secondary battery including a sheet-shaped first-electrode-functioning base material having a function as a first electrode and a function as a base material, a front-side storage layer formed on a front side of the first-electrode-functioning base material, a front-side second electrode layer layered on the front-side storage layer, a rear-side storage layer formed on a rear side of the first-electrode-functioning base material, and a rear-side second electrode layer layered on the rear-side storage layer.

8 Claims, 8 Drawing Sheets (51) Int. Cl.
*H01M 10/04* (2006.01)
*H01M 10/30* (2006.01)
*H01M 10/0525* (2010.01)
*H02J 7/00* (2006.01)
*H01L 49/00* (2006.01)
*H01L 31/0224* (2006.01)

(52) U.S. Cl.
CPC ... *H01M 10/0413* (2013.01); *H01M 10/0436* (2013.01); *H01M 10/052* (2013.01); *H01M 10/0525* (2013.01); *H01M 10/30* (2013.01); *H02J 7/0042* (2013.01); *H01M 2220/30* (2013.01)

(58) Field of Classification Search
CPC ............ H01M 10/052; H01M 2220/30; H01L 31/022425; H01L 49/00; H02J 7/0042
See application file for complete search history.

(56) References Cited

FOREIGN PATENT DOCUMENTS

| WO | WO 2012/046325 | * | 4/2012 | ............ H01M 4/131 |
|----|----|----|----|----|
| WO | WO2012 046325 A2 | | 4/2012 | |
| WO | WO2013/153603 A1 | | 10/2013 | |
| WO | WO2013/154046 A1 | | 10/2013 | |
| WO | WO2013/161051 A1 | | 10/2013 | |
| WO | WO2013/161053 A1 | | 10/2013 | |
| WO | WO2013/161926 A1 | | 10/2013 | |
| WO | WO2013/161927 A1 | | 10/2013 | |

\* cited by examiner

SECONDARY BATTERY

TECHNICAL FIELD

The present invention relates to a secondary battery and a method of manufacturing the same, and for example, relates to a secondary battery (hereinafter, called a quantum battery as well) based on an operational principle of forming a new energy level in a band gap and capturing an electron by utilizing a photoexcited structural change of a metal oxide.

BACKGROUND ART

There have been known nickel-metal hydride (Ni-MH) batteries, lithium ion secondary batteries (LIB), and the like as secondary batteries. Recently, there is a need for small and high-capacity batteries. Accordingly, in some cases, a plurality of units (hereinafter, called unit cells) each functioning as a secondary cell are superposed.

Figure 1:
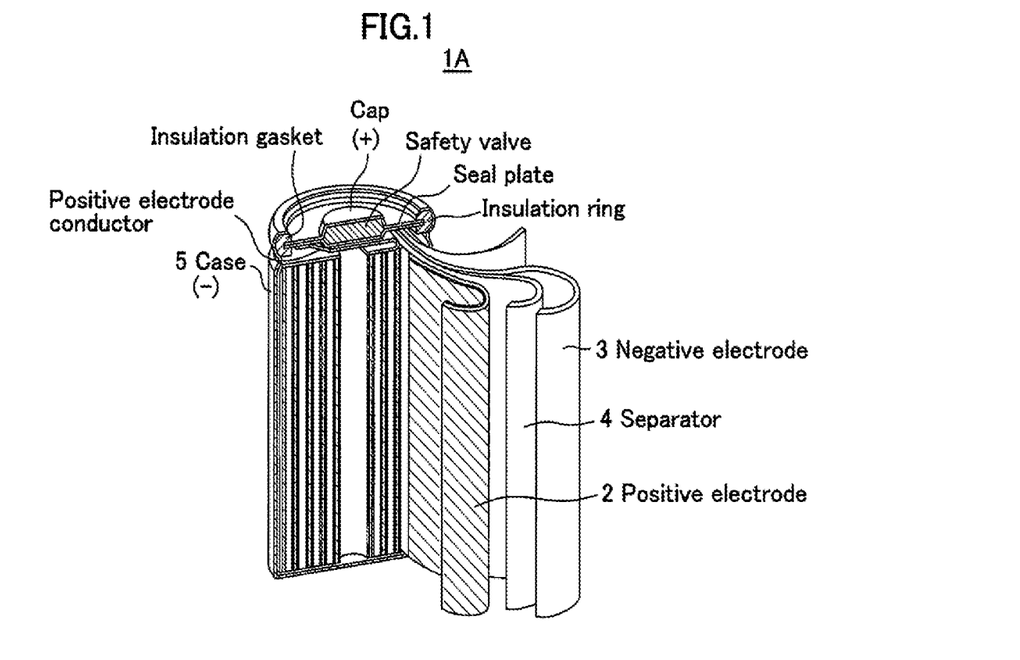
FIG. 1 is a perspective view illustrating an internal structure of a conventional cylindrical nickel-metal hydride (Ni-MH) battery with a part thereof broken.
Figure 2:
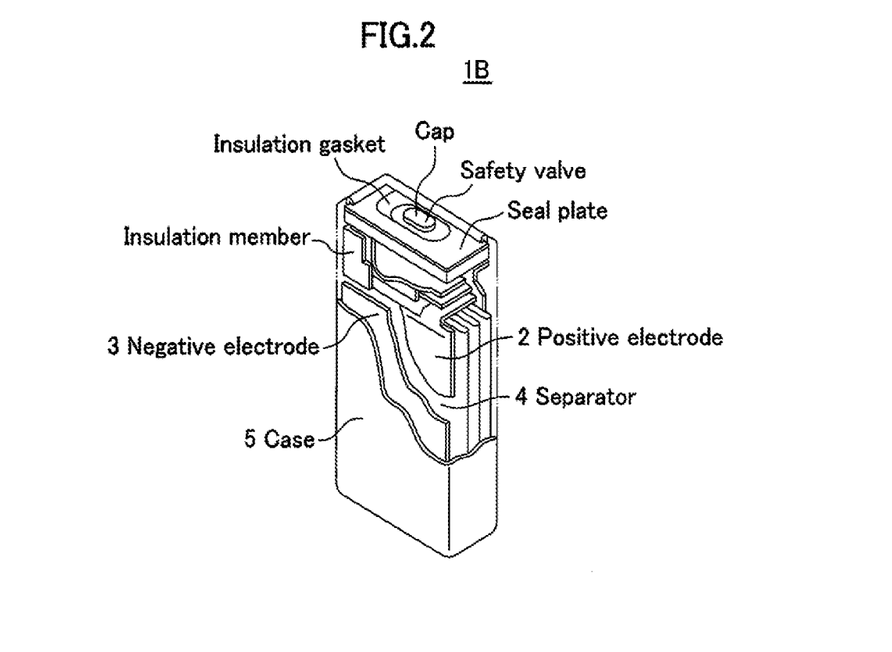
FIG. 2 is a perspective view illustrating an internal structure of a conventional rectangular nickel-metal hydride (Ni-MH) battery with a part thereof broken.

Structures of a cylindrical type and a rectangular type of nickel-metal hydride (Ni-MH) batteries as illustrated in FIGS. 1 and 2 are disclosed on pages 319-320 in Non-Patent Document 1. A cylindrical type battery 1A is completed as a battery by winding a positive electrode 2 and a negative electrode 3 each being thin-plate-shaped to have a predetermined shape in whorl via a separator 4 (the whorl being perceived as superposed unit cells), inserting the whorl into a cylindrical case 5, and performing sealing after an electrolyte is poured therein. A rectangular battery 1B is completed as a battery by layering structures each having a separator 4 between a positive electrode 2 and a negative electrode 3 each being thin-plate-shaped to have a predetermined shape, inserting the structures into a rectangular case 5, and performing sealing after an electrolyte is poured therein.

Figure 3:
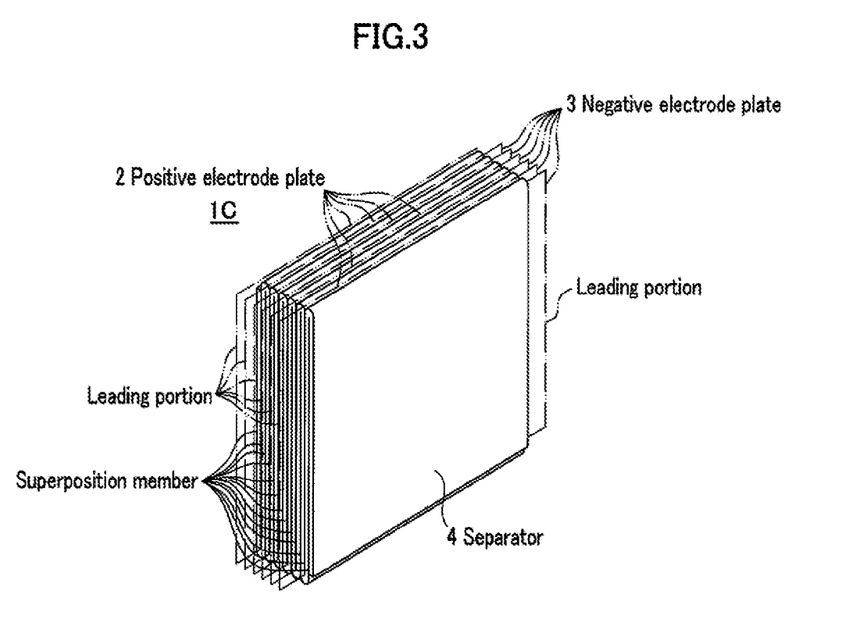
FIG. 3 is a perspective view illustrating an internal structure (electrode plate groups) of a rectangular lithium ion secondary battery disclosed in Patent Document 1.

In Patent Document 1, there is disclosed an internal structure (electrode plate group) of a rectangular lithium ion secondary battery as illustrated in FIG. 3. In the electrode plate group 1C, positive electrode plates 2 and negative electrode plates 3 are alternately inserted to valley grooves of a continuous body of a zigzag-folded separator 4 and flattened by being pressed in a zigzag direction. Such an electrode plate group is inserted into a rectangular external enclosure and sealing is performed after an electrolyte is poured therein to complete a rectangular battery.

Further, recently, all-solid-state secondary cells structured with solid thin films have been researched and developed as being expected to actualize downsized secondary cells. FIG. 4 is a perspective view and a sectional view illustrating a structure of an all-solid-state secondary cell. In FIG. 4, terminal members such as a positive electrode terminal and a negative electrode terminal, mounting members such as an external member and a cover member, and the like are not illustrated. An all-solid-state secondary cell 1D includes a solid layer (hereinafter, called a storage layer) 6 in which internal change occurs during charging and discharging between a negative electrode layer 3 and a positive electrode layer 2. Examples of the all-solid-state secondary cell 1D include a quantum cell described above and an all-solid-state lithium ion secondary cell. In a case of a quantum cell, a layer (called a charging layer as described later) to store (capture) electrons with a charging operation and to release the charged electrons with a discharging operation is arranged between the negative electrode layer 3 and the positive electrode layer 2. The charging layer corresponds to the storage layer 6. In a case of the all-solid-state lithium ion secondary cell, a solid electrolyte layer is arranged between the negative electrode layer 3 and the positive electrode layer 2. The solid electrolyte layer corresponds to the storage layer 6. Here, in a case that the structure illustrated in FIG. 4 is to be layered as a unit cell, it is preferable that a seal 7 is arranged around the storage layer 6 and the like for providing insulation between the negative electrode layer 3 and the positive electrode layer 2 and for protecting the periphery of the storage layer 6. Here, the seal 7 is not an essential structural element.

As is widely known, regarding the all-solid-state secondary cell 1D as well, terminal voltage can be heightened by layering unit cells in series and energy density can be increased by layering unit cells in parallel.

Figure 5:
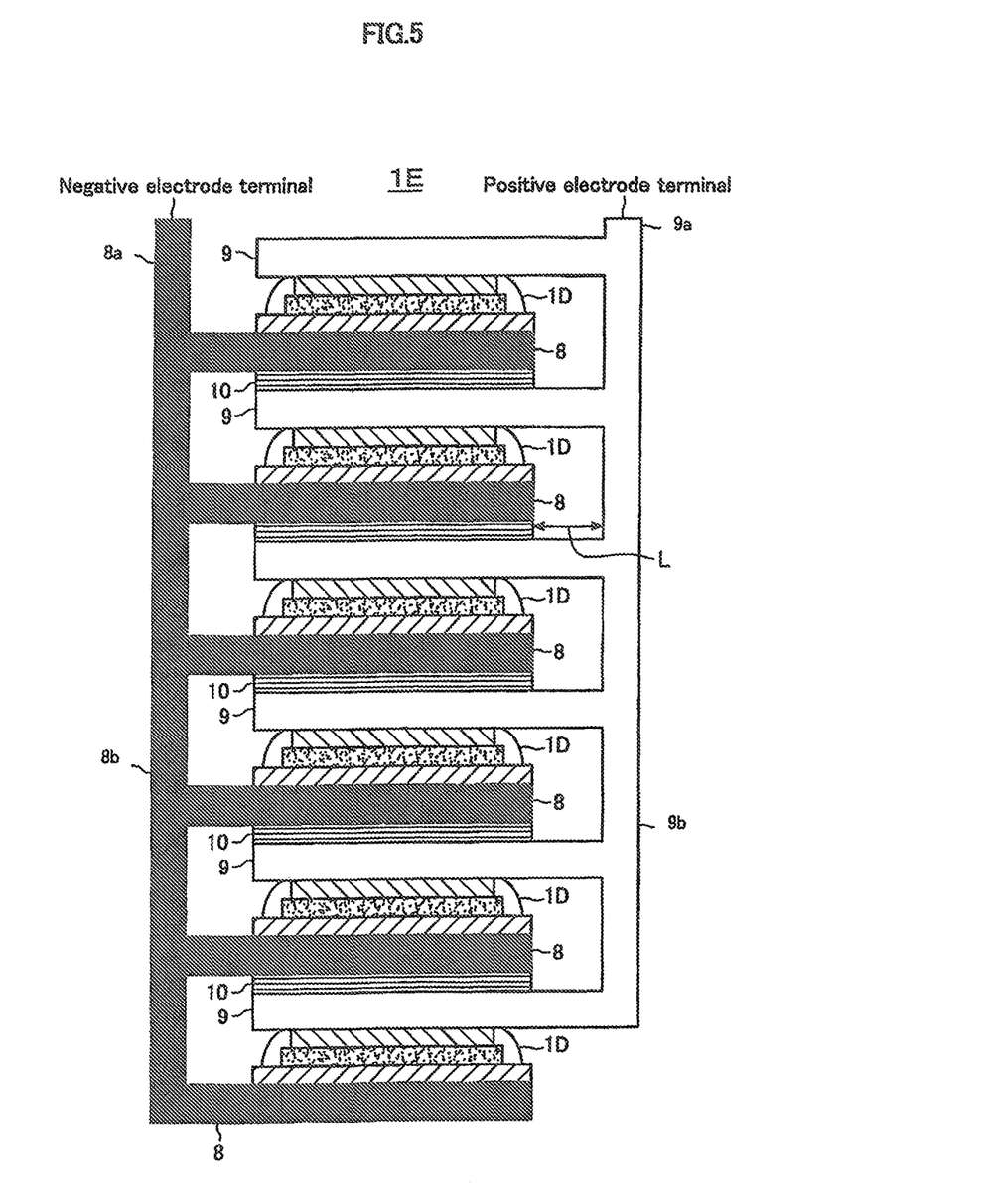
FIG. 5 is a sectional view illustrating an anticipatable structure of a secondary battery in which a plurality of unit cells are parallel-connected with each unit cell being an all-solid-state secondary cell.

FIG. 5 is a sectional view illustrating an easily-anticipatable secondary battery 1E in which a plurality of unit cells are parallel-connected with each unit cell being the secondary cell 1D. In the secondary battery 1E, each unit cell 1D is sandwiched between the negative electrode terminal plate 8 and the positive electrode terminal plate 9, and further, an insulation layer 10 is arranged between the positive electrode terminal plate 9 of a unit cell and the negative electrode terminal plate 8 of a unit cell at the one-stage upper side therefrom. A plurality of the negative electrode terminal plates 8 are connected by a negative electrode terminal connection portion 8b and a plurality of the positive electrode terminal plates 9 are connected by a positive electrode terminal connection portion 9b. The negative electrode terminal connection portion 8b and the positive electrode terminal connection portion 9b include extension portions 8a, 9a, respectively, for exposing the negative electrode terminal and the positive electrode terminal to the outside of a mounting member (not illustrated). Assuming that the secondary cell 1D has terminal voltage $V_0$ and current capacity $I_0$, and the number (parallel-connected number) of layers of the secondary cells 1D is N, capacity of the secondary battery 1E becomes to $N \times I_0$ (e.g., $6I_0$ if the number of layers is six) while terminal voltage thereof remains at $V_0$.

To actualize a secondary battery having high terminal voltage and large energy density, unit cells are simply required to be arranged in combination of a multilayer in serial connection and a multilayer in parallel connection. Here, for example, owing to that a unit cell 1D sandwiched between the negative electrode terminal plate 8 and the positive electrode terminal plate 9 in FIG. 5 is replaced with a multilayer of a plurality of unit cells in serial connection, it is possible to structure a secondary battery having higher terminal voltage and larger energy density.

CITED DOCUMENT

Patent Document

Patent Document 1: Japanese Patent Application Laid-Open No. 2009-140707

Non-Patent Document

Non-Patent Document 1: Committee of Battery Technology in Electrochemical Society (February 2010): Battery handbook. Ormsha, Ltd.

SUMMARY OF THE INVENTION

In the conventional secondary battery illustrated in FIGS. 1 to 3, it is required to arrange a separator for providing insulation between a positive electrode and a negative electrode of adjacent unit cells and to ensure accommodation space for an electrolyte. Accordingly, it has been difficult to reduce whole volume of the secondary battery. In the secondary battery illustrated in FIGS. 1 to 3, since chemical reaction is utilized, deterioration of charging/discharging performance and reduction of lifetime may be caused. Further, since an electrolyte is used, there may be a risk of fluid leakage. Furthermore, in a lithium ion secondary battery, there is a fear of reliability degradation due to overcharging and charging/discharging, and short-circuit occurrence between electrodes due to usage of an electrolyte.

Most of problems caused by using an electrolyte can be solved by using an all-solid-state secondary cell.

As described above, energy density of a secondary battery can be increased by parallel-connecting a plurality of unit cells. However, in the secondary battery 1E as illustrated in FIG. 5, it is required to arrange an insulation layer 10 between the negative electrode terminal plate 8 and the positive electrode terminal plate 9 of adjacent unit cells. Further, it is required to arrange the negative electrode terminal plates 8 as the same number of the negative electrode layers 3 of the unit cells and to arrange the positive electrode terminal plates 9 as the same number of the positive electrode layers 2 of the unit cells. Accordingly, volume of the secondary battery 1E is increased.

In general, volume efficiency of a battery is obtained as a ratio of effective volume of the battery to whole volume of the battery. In consideration of cycles of charging a secondary battery, it is required for the secondary battery to have large energy density. Here, it is preferable that whole volume of the battery is small even though energy density is increased. Further, reduction of whole volume of the battery contributes to downsizing of the secondary battery. Here, the negative electrode terminal plates 8 and the positive electrode terminal plates 9 are necessary for structuring a battery. However, due to no direct contribution to charging, the insulation layers 10 are obstructive factors for increasing energy density.

It is possible to increase the number of layers of unit cells in parallel connection in accordance with increase of desired energy density. However, the number of the insulation layers 10 is increased (as well as the number of the negative electrode terminal plates 8 and the positive electrode terminal plates 9) in accordance with increase of the number of layers. As a result, whole volume is further increased.

In either parallel connection or serial connection, a secondary battery in which a plurality of unit cells are layered has high requirements for positioning of the respective unit cells. In a case of the secondary battery 1E illustrated in FIG. 5, it is preferable, from a viewpoint of reducing whole volume, that the negative electrode terminal connection portions 8b and the positive electrode terminal connection portions 9b are arranged closer to the unit cells 1D (i.e., a gap L in FIG. 5 is smaller). For example, if any of the unit cells is layered as being shifted rightward in FIG. 5 and the negative electrode layer 3 of the unit cell is contacted to the positive electrode terminal connection portion 9b, a short-circuit is formed thereat. Thus, the respective unit cells have high requirements for positioning. Accordingly, there may be a possibility to cause decrease of manufacturing efficiency.

Further, owing to that unit cells as the number of layers have to be layered in a layering process, there has been large workload for manufacturing.

In such a situation, there has been desired an all-solid-state secondary battery and a method of manufacturing the same in which a storage layer is sandwiched between a positive electrode layer and a negative electrode layer and which has high energy density and less manufacturing processes.

To solve such problems, a secondary battery as a first invention includes (1) a sheet-shaped first-electrode-functioning base material having a function as a first electrode and a function as a base material, (2) a front-side storage layer formed on a front side of the first-electrode-functioning base material, (3) a front-side second electrode layer layered on the front-side storage layer, (4) a rear-side storage layer formed on a rear side of the first-electrode-functioning base material, and (5) a rear-side second electrode layer layered on the rear-side storage layer.

A method of manufacturing a secondary battery as a second invention includes (1) layering a first oxide semiconductor layer respectively on a front side and a rear side of a sheet-shaped first-electrode-functioning base material having a function as a first electrode and a function as a base material, (2) layering a front-side charging layer on the front-side first oxide semiconductor layer, (3) layering a rear-side charging layer on the rear-side first oxide semiconductor layer, (4) irradiating the front-side charging layer and the rear-side charging layer with ultraviolet light, (5) layering a second oxide semiconductor layer and a second electrode layer on the front-side charging layer, and (6) layering a second oxide semiconductor layer and a second electrode layer on the rear-side charging layer.

A method of manufacturing a secondary battery as a third invention includes (1) layering a first oxide semiconductor layer continuously from a front side to a rear side of a sheet-shaped first-electrode-functioning base material having a function as a first electrode and a function as a base material, (2) layering a charging layer to cover a part or all of the first oxide semiconductor layer, (3) irradiating the charging layer with ultraviolet light, and (4) layering a second oxide semiconductor layer and a second electrode layer to cover a part or all of the charging layer.

According to the secondary battery and the method for manufacturing the same of the present invention, the single first electrode layer (first-electrode-functioning base material) functions as first electrode layers of two unit cells that are formed at mutually-opposite sides thereagainst. Therefore, energy density can be increased owing to that thickness of the first electrode layer can be effectively halved while maintaining strength as the base material. Further, since two unit cells can be formed with single manufacturing of the first electrode layer (first-electrode-functioning base material), there arises another effect of reducing manufacturing processes.

Further, owing to that the single first electrode layer (first-electrode-functioning base material) functions as first electrode layers of two unit cells that are formed at mutually-opposite sides thereagainst, a process of connecting the first electrode layers can be eliminated when the two unit cells are to be parallel-connected. Accordingly, there arises another effect of preventing oxidation at a layered portion due to thermal treatment during the process.

EMBODIMENTS OF THE INVENTION

(A) First Embodiment

In the following a first embodiment of a secondary battery and a method of manufacturing the same will be described with reference to the drawings. The secondary battery of the first embodiment is structured as a quantum battery.

(A-1) Basic Structure of Secondary Battery of First Embodiment

Figures 4A, 4B:
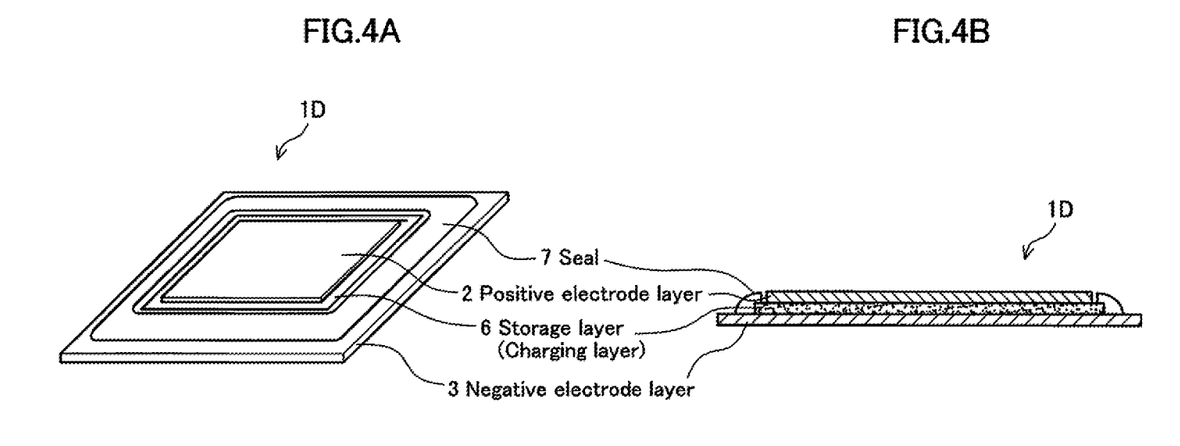
FIG. 4 is a perspective view and a sectional view illustrating a structure of an all-solid-state secondary cell.
Figure 6:
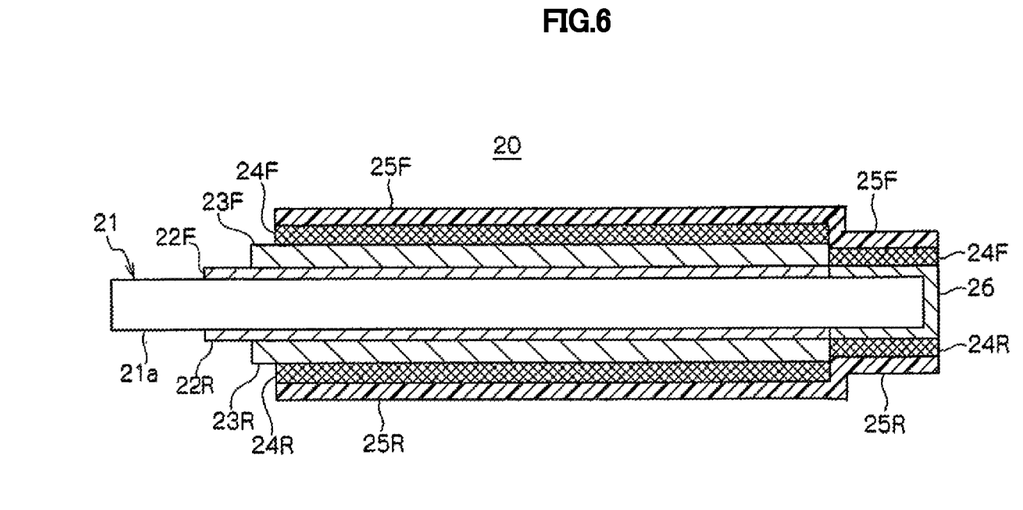
FIG. 6 is a sectional view illustrating a structure of a secondary battery of a first embodiment.
Figure 7A:
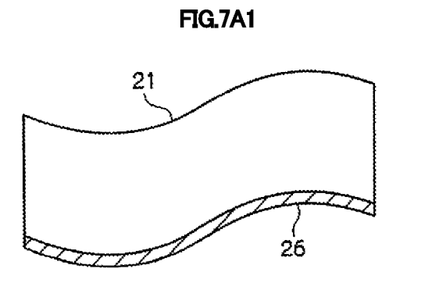
FIG. 7 is an explanatory view illustrating a method of manufacturing a secondary battery of the first embodiment.
Figure 7A:
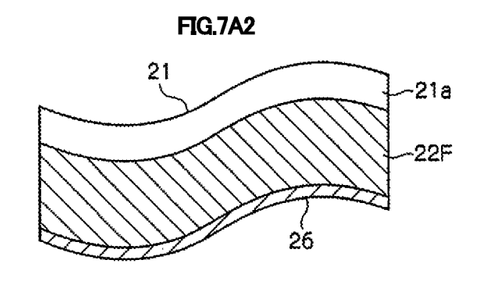
Figure 7A:
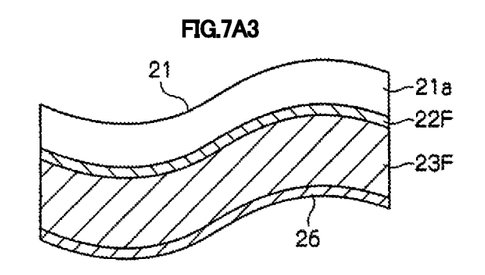
Figure 7A:
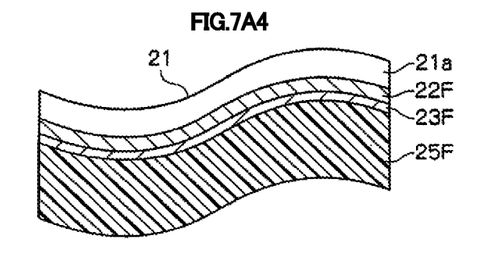
Figure 7B:
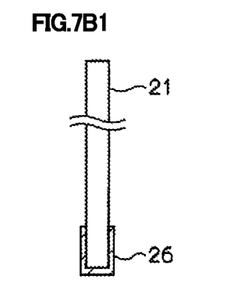
Figure 7B:
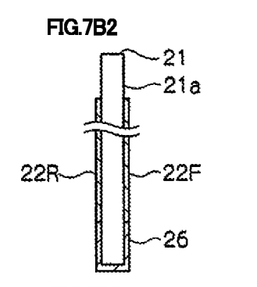
Figure 7B:
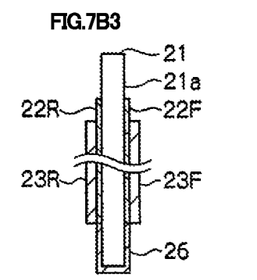
Figure 7B:
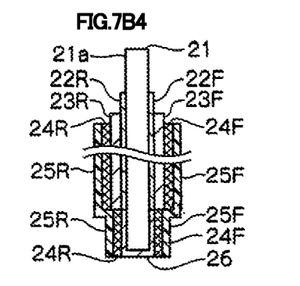

FIG. 6 is a sectional view illustrating a structure of a secondary battery 20 according to the first embodiment as viewing from the same direction as FIG. 4(B). In FIG. 6, dimensions in the thickness direction are more emphasized than those in the planer direction.

As illustrated in FIG. 6, the secondary battery 20 of the first embodiment includes a sheet-shaped negative-electrode-functioning base material 21, a front-side n-type metal oxide semiconductor layer 22F, a front-side charging layer 23F, a front-side p-type metal oxide semiconductor layer 24F, a front-side positive electrode layer 25F, a rear-side n-type metal oxide semiconductor layer 22R, a rear-side charging layer 23R, a rear-side p-type metal oxide semiconductor layer 24R, a rear-side positive electrode layer 25R, and a base material end face insulating portion 26.

A unit secondary cell (unit cell) at the front side is structured with the sheet-shaped negative-electrode-functioning base material 21, the front-side n-type metal oxide semiconductor layer 22F, the front-side charging layer 23F, the front-side p-type metal oxide semiconductor layer 24F, and the front-side positive electrode layer 25F. Further, a unit secondary cell (unit cell) at the rear side is structured with the sheet-shaped negative-electrode-functioning base material 21, the rear-side n-type metal oxide semiconductor layer 22R, the rear-side charging layer 23R, the rear-side p-type metal oxide semiconductor layer 24R, and the rear-side positive electrode layer 25R.

The secondary battery 20 has a feature that unit cells are formed respectively on both faces of the base material. Here, it is not distinguishable which face of both the faces is the front side. In the following description, the upper face in FIG. 6 is called the front side and the lower face in FIG. 6 is called the rear side, for convenience. Further, in the following, description is provided on the secondary battery 20 that is shaped as a rectangular sheet as having a large length difference between a short side and a long side (see FIG. 7 described later). When appropriate, the lateral direction in FIG. 6 is called a width direction and the normal direction to the depiction of FIG. 6 is called an elongated direction.

The sheet-shaped negative-electrode-functioning base material 21 functions as a sheet-shaped base material when a thin-film forming process is performed as well as a negative electrode main body. FIG. 4 illustrating the above-mentioned conventional secondary cell (quantum cell) 1D illustrates a secondary cell that is obtained by being removed from a base material after a variety of thin-film forming processes are performed on the base material. Compared to the conventional secondary cell (quantum cell) 1D, the secondary battery 20 of the first embodiment has a feature that a single negative electrode layer (the sheet-shaped negative-electrode-functioning base material 21) functions as negative electrode layers for two unit cells that are plane-symmetrical with respect thereto. One end (the left end in FIG. 6) 21a in the width direction of the sheet-shaped negative-electrode-functioning base material 21 (lateral direction in FIG. 6) functions as a leading portion of the negative electrode without being covered with the n-type metal oxide semiconductor layers 22F, 22R, the charging layers 23F, 23R, the p-type metal oxide semiconductor layers 24F, 24R, and the positive electrode layers 25F, 25R.

The sheet-shaped negative-electrode-functioning base material 21 may be formed of a single conductive material or may be formed by depositing a conductive thin film onto a surface of a conductor or an insulator with sputtering, plating or the like. For example, a stainless steel sheet (SUS sheet) may be used as the sheet-shaped negative-electrode-functioning base material 21.

The charging layers 23F, 23R at both sides are layers to store electrons with a charging operation, to release the stored electrons with a discharging operation, and to hold (store) the electrons in a state without charging and discharging performed. For causing the charging layers to function as described above, for example, as disclosed in International Patent Application Laid-open No. WO2008/053561, it is simply required to form trap levels in a band gap in the charging layer based on photoexcited structural change. Here, translucent metal oxide being a semiconductor having a predetermined value or more of a band gap forms a charging layer in which the metal oxide insulation-coated in a particulate state forms a layer. When electrons in a valence band are excited into a conduction band by being irradiated with ultraviolet light, a part of the electrons are moved to a negative electrode through an energy barrier formed of an insulation film. Accordingly, an electron-absent depletion level is moved into the band gap owing to structural change that an interatomic distance is varied at the part from which electrons in the charging layer are removed, so that the trap level is formed. After a number of trap levels are formed in the band gap by irradiation with a sufficient amount of light, a positive electrode is arranged at the opposite side of the charging layer to the negative electrode through the energy barrier formed of an insulator or the like. Then, when a voltage is applied between both the electrodes, charging and discharging can be performed with capturing and releasing of electrons at the trap levels. This is the function of the charging layer in a quantum cell.

The n-type metal oxide semiconductor layer 22F, 22R at each side has a function of an energy barrier at the charging layer 23F, 23R as being similar to an insulation layer around the metal oxide. Accordingly, it is possible to prevent occurrence of a portion where the energy barrier does not exist due to direct contact of the metal oxide with the negative electrode for some reason not through an insulation layer. A material of the n-type metal oxide semiconductor layers 22F, 22R is not limited. For example, titanium dioxide ($TiO_2$) may be used therefor.

When a quantum battery is recognized as being structured with a portion to hold electric energy and two electrodes as being similar to a general secondary battery, the n-type metal oxide semiconductor layers 22F, 22R can be regarded as elements of the negative electrode.

The positive electrode layer 25F, 25R at each side is simply required to be formed as a conductive layer. A material of the positive electrode layers 25F, 25R is not limited. For example, aluminum (Al) may be used therefor. In a quantum battery, the p-type metal oxide semiconductor layers 24F, 24R are arranged to be in contact with the charging layers 23F, 23R to prevent unnecessary entering of electrons from the positive electrode layers 25F, 25R to the charging layers 23F, 23R. A material of the p-type metal oxide semiconductor layers 24F, 24R is not limited. For example, nickel oxide (NiO) may be used therefor.

The base material end face insulating portion 26 is arranged to prevent short circuit between the sheet-shaped negative-electrode-functioning base material 21 functioning as a negative electrode and the positive electrode layers 25F, 25R at one end of the sheet-shaped negative-electrode-functioning base material 21 where the charging layers 23F, 23R are not arranged. A material of the base material end face insulating portion 26 is not limited. For example, it is possible to use a rubber-base material, a polyolefin-made material, a fluorine resin, or the like. Alternatively, it is possible to use alumina ($Al_2O_3$) or silica ($SiO_2$). Here, the base material end face insulating portion 26 may be formed before forming the n-type metal oxide semiconductor layers 22F, 22R. Alternatively, the base material end face insulating portion 26 may be formed, after forming the n-type metal oxide semiconductor layers 22F, 22R, before forming the charging layers 23F, 23R or after forming the charging layers 23F, 23R. Since a high temperature process is performed when forming the charging layers 23F, 23R, it is preferable for the base material end face insulating portion 26 to adopt a thermally-resistant material as the material thereof when being formed before forming the charging layers.

FIG. 6 illustrates an example in which the n-type metal oxide semiconductor layers 22F, 22R and the charging layers 23F, 23R are formed to parts just before one end of the sheet-shaped negative-electrode-functioning base material 21 and the base material end face insulating portion 26 is formed to have a U-shaped section. A thickness of the base material end face insulating portion 26 at the front side and the rear side of the sheet-shaped negative-electrode-functioning base material 21 is approximately the same as that of the n-type metal oxide semiconductor layers 22F, 22R. Edges of the charging layers 23F, 23R at the side of the base material end face insulating portion 26 are approximately matched with edges of the n-type metal oxide semiconductor layers 22F, 22R at the side of the base material end face insulating portion 26. As a result, the front face and the rear face of the base material end face insulating portion 26 have difference in level to the edges of the charging layers 23F, 23R. In the example of FIG. 6, the p-type metal oxide semiconductor layers 24F, 24R and the positive electrode layers 25F, 25R are layered as well on the front face and the rear face of the base material end face insulating portion 26. Consequently, each of the positive electrode layers 25F, 25R is stepped at the one end side of the sheet-shaped negative-electrode-functioning base material 21.

At another end in the width direction of the sheet-shaped negative-electrode-functioning base material 21 where the base material end face insulating portion 26 is not arranged, the sheet-shaped negative-electrode-functioning base material 21 is exposed to the outside by a predetermined length to form the leading portion 21a. At both of the front face and the rear face, distances to the end face of the n-type metal oxide semiconductor layers 22F, 22R are shortest, distances thereto of the charging layers 23F, 23R are next-shortest, and distances thereto of the p-type metal oxide semiconductor layers 24F, 24R and the positive electrode layers 25F, 25R are longest. Owing to such a stepped structure, short circuit is prevented from occurring between the sheet-shaped negative-electrode-functioning base material 21 and the positive electrode layers 25F, 25R.

Here, a structure at the base material end is not limited to the above as long as being capable of preventing the short circuit of the positive electrode layers 25F, 25R.

In FIG. 6, the end face (face not being the front face and the rear face) of the base material end face insulating portion 26 is exposed to the outside. However, it is also possible to additionally cover the end face of the base material end face insulating portion 26 with a p-type metal oxide semiconductor layer and a positive electrode layer. In this case, the front-side p-type metal oxide semiconductor layer 24F and the rear-side p-type metal oxide semiconductor layer 24R may be joined by the covering p-type metal oxide semiconductor layer and the front-side positive electrode layer 25F and the rear-side positive electrode layer 25R may be joined by the covering positive electrode layer.

Further, in FIG. 6, a front side portion and a rear side portion of the base material end face insulating portion 26 cover the end side of the sheet-shaped negative-electrode-functioning base material 21 (in other words, the front side portion and the rear side portion thereof are layered on the end side of the sheet-shaped negative-electrode-functioning base material 21). However, it is also possible that the front side portion and the rear side portion thereof cover the end side of the n-type metal oxide semiconductor layers 22F, 22R formed on the sheet-shaped negative-electrode-functioning base material 21.

In the above, description is provided on the short-circuit prevention structure at one end in the width direction of the sheet-shaped negative-electrode-functioning base material 21. Here, being different from the feature of the first embodiment, a short-circuit prevention structure being similar to the above may be arranged as well at one end or both ends in the elongated direction of the sheet-shaped negative-electrode-functioning base material 21. Further, a process being similar to that performed on the abovementioned leading portion 21a may be performed as well on one end or both ends in the elongated direction of the sheet-shaped negative-electrode-functioning base material 21.

A-2) Method of Manufacturing Secondary Battery of First Embodiment

Next, description will be provided on a method of manufacturing the secondary battery 20 of the first embodiment having the structure illustrated in FIG. 6. FIG. 7 is an explanatory view illustrating the method of manufacturing a secondary battery of the first embodiment. FIGS. 7(A1) to 7(A4) are schematic perspective views and FIGS. 7(B1) to 7(B4) are sectional views. In the sectional views of FIGS. (B1) to 7(B4), intermediately-formed states and a finished piece of a secondary battery are rotated clockwise by 90 degrees as compared to the sectional view illustrated in FIG. 6.

First, as illustrated in FIGS. 7(A1) and 7(B1), the base material end face insulating portion 26 is formed at the vicinity of one side in the width direction of the sheet-shaped negative-electrode-functioning base material 21. Being dependent on a method of the forming, masking is performed on a non-forming region during the forming. For example, a SUS sheet is used as the sheet-shaped negative-electrode-functioning base material 21 and the base material end face insulating portion 26 is formed on one end thereof. For example, in a case that the base material end face insulating portion 26 is made of resin, the base material end face insulating portion 26 is formed with a general film formation for resin coating (e.g., spray painting). For example, in a case that the base material end face insulating portion 26 is made of alumina ($Al_2O_3$), silica ($SiO_2$), or the like, the base material end face insulating portion 26 is formed (film-formed) with sputtering, an evaporation method, a chemical vapor deposition (CVD) method, a coating pyrolysis method, or the like.

Next, as illustrated in FIGS. 7(A2) and 7(B2), the n-type metal oxide semiconductor layers 22F, 22R are formed while ensuring the leading portion 21a at the sheet-shaped negative-electrode-functioning base material 21 and appropriately performing masking not to be layered on the base material end face insulating portion 26. For example, titanium dioxide ($TiO_2$) is adopted as the material of the n-type metal oxide semiconductor layers 22F, 22R and the n-type metal oxide semiconductor layers 22F, 22R are formed with sputtering, an evaporation method, a CVD method, a coating pyrolysis method, or the like. Here, the front-side n-type metal oxide semiconductor layer 22F and the rear-side n-type metal-oxide semiconductor layer 22R may be concurrently formed or may be formed one by one.

In the case of the secondary battery 20 of the first embodiment illustrated in FIG. 6, the base material end face insulating portion 26 and the n-type metal oxide semiconductor layers 22F, 22R are not in layering relation. Therefore, being different from the above, the base material end face insulating portion 26 may be formed after the n-type metal oxide semiconductor layers 22F, 22R are formed (film-formed).

Next, as illustrated in FIGS. 7(A3) and 7(B3), the charging layers 23F, 23R are formed while ensuring the leading portion 21a at the sheet-shaped negative-electrode-functioning base material 21 so that a part of the n-type metal oxide semiconductor layers 22F, 22R is exposed and appropriately performing masking so that the charging layers 23F, 23R are not layered on the base material end face insulating portion 26. Details of a method of forming the charging layers 23F, 23R are disclosed in International Patent Application Laid-open No. WO2012/046325. Here, the front-side charging layer 23F and the rear-side charging layer 23R may be concurrently formed or may be formed one by one.

Next, as illustrated in FIGS. 7(A4) and 7(B4), the p-type metal oxide semiconductor layers 24F, 24R are formed and the positive electrode layers 25F, 25R are formed thereafter while ensuring the leading portion 21a at the sheet-shaped negative-electrode-functioning base material 21 so that a part of the n-type metal oxide semiconductor layers 22F, 22R and a part of the charging layers 23F, 23R are exposed and appropriately performing masking so that the p-type metal oxide semiconductor layer and the positive electrode layer are not formed at the end face of the base material end face insulating portion 26. FIGS. 7(A4) and 7(B4) illustrate a state after the positive electrode layers 25F, 25R are formed. For example, nickel oxide (NiO) is adopted as the material of the p-type metal oxide semiconductor layers 24F, 24R and the p-type metal oxide semiconductor layers 24F, 24R are formed with sputtering, an evaporation method, a CVD method, a coating pyrolysis method, or the like. Subsequently, aluminum (Al) is adopted as the material of the positive electrode layers 25F, 25R and the positive electrode layers 25F, 25R are formed with sputtering, an evaporation method, a CVD method, a coating pyrolysis method, or the like. Here, the front-side p-type metal oxide semiconductor layer 24F and the rear-side p-type metal-oxide semiconductor layer 24R may be concurrently formed or may be formed one by one. Further, the front-side positive electrode layer 25F and the rear-side positive electrode layer 25R may be concurrently formed or may be formed one by one.

With the abovementioned processes, the secondary battery 20 of the first embodiment having the structure illustrated in FIG. 6 is formed.

In the above, with respect to forming the n-type metal oxide semiconductor layers 22F, 22R, the charging layers 23F, 23R, the p-type metal oxide semiconductor layers 24F, 24R, and the positive electrode layers 25F, 25R, processes on both the faces of the sheet-shaped negative-electrode-functioning base material 21 are performed concurrently. However, it is also possible, for example, to perform forming processes at the front side at once and to perform forming processes at the rear side after the forming processes at the front side are completed. That is, the front-side n-type metal oxide semiconductor layer 22F, the front-side charging layer 23F, the front-side p-type metal oxide semiconductor layer 24F, and the front-side positive electrode layer 25F may be sequentially formed on the sheet-shaped negative-electrode-functioning base material 21 with the base material end face insulating portion 26 formed. Then, the rear-side n-type metal oxide semiconductor layer 22R, the rear-side charging layer 23R, the rear-side p-type metal oxide semiconductor layer 24R, and the rear-side positive electrode layer 25R may be sequentially formed thereon.

The processes in the above may be changed in part in accordance with a mounting structure of the secondary battery 20 of the first embodiment.

For example, in a case that the manufactured secondary battery 20 of the first embodiment is to be mounted after being cut into pieces each having a predetermined length in the elongated direction, the sheet-shaped negative-electrode-functioning base material 21 may be exposed in the width direction at the cut positions.

Further, for example, in a case that the manufactured secondary battery 20 of the first embodiment is to be stored in a case as being folded into an accordion shape, it is also possible not to form specific kinds of thin films at a fold part to be at an inner side when folded to reduce stress when being folded. For example, it is also possible not to form the positive electrode layers 25F, 25R at a fold part. Further, it is also possible not to form the positive electrode layer 25F, 25R, the p-type metal oxide semiconductor layers 24F, 24R, and the charging layers 23F, 23R at a fold part. Alternatively, it is also possible to reduce stress when being folded by selectively eliminating a thin film at a fold part with laser or the like.

(A-3) Mounting Structure of Secondary Battery of First Embodiment

Next, description will be provided on an example of a mounting structure of the secondary battery 20 of the first embodiment having the structure illustrated in FIG. 6.

Any method of mounting the secondary battery 20 of the first embodiment having the structure illustrated in FIG. 6 may be adopted. For example, the secondary battery 20 may be attached as a power source of a requiring apparatus as remaining in a planer sheet shape. Alternatively, for example, the manufactured secondary battery 20 may be mounted after being cut into pieces each having a predetermined length in the elongated direction.

Here, considering the feature of having a sheet shape with a structure functioning as a secondary cell formed on each face, a mounting structure as illustrated in FIG. 8 may be adopted.

Figure 8A:
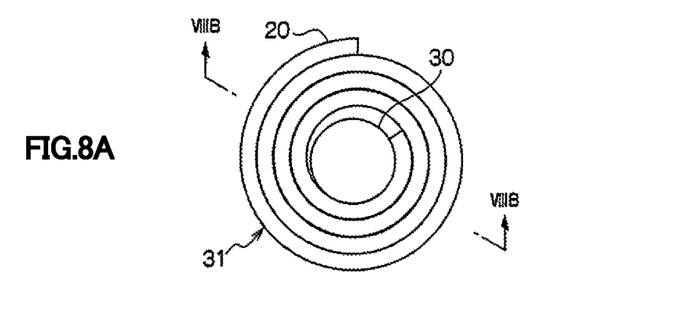
FIG. 8 is an explanatory view illustrating an example of a mounting structure of a second secondary battery of the first embodiment.
Figure 8B:
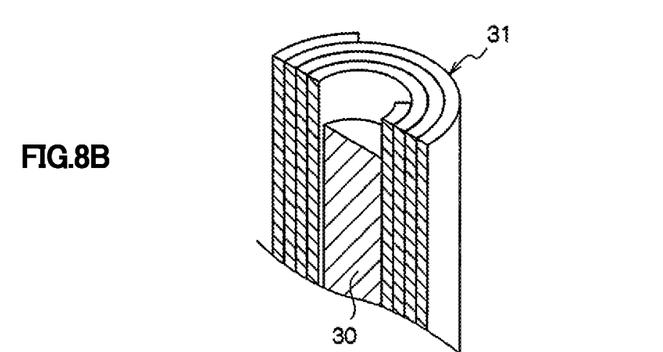

That is, as illustrated in an image-like plane view of FIG. 8(A), the secondary battery 20 of the first embodiment is wound to a cylindrical core member 30 to form a wound roll 31 of the secondary battery 20. After forming the wound roll 31, the core member 30 may be kept as it is or may be removed therefrom. The core member 30 may be formed by attaching a conductive material that is applicable for an electrode to the surface thereof so that the core member 30 functions as an external positive electrode member. FIG. 8(B) is an image-like perspective view viewing the section along line VIIIB-VIIIB in FIG. 8(A) from the upper side. In the following, the mounting structure is described from the upper side to the lower side along the vertical direction in FIG. 8(B). In FIGS. 8(A) and 8(B), the layer structure of the secondary battery 20 is skipped.

In the wound roll 31, a front-side positive electrode layer 25F of a secondary cell portion at a certain turn number is in contact with a rear-side positive electrode layer 25R of a secondary cell portion at a one-incremented turn number. Here, the winding does not cause the positive electrode layers to be in contact with another layer.

The wound roll 31 is covered on the side of the leading portions 21a of the sheet-shaped negative-electrode-functioning base material 21 with an exposed negative electrode member 32 (may be regarded as an upper cover) made of a conductive material to which an external negative electrode terminal is contacted. The exposed negative electrode member 32 includes a circular top plate and a cylinder member arranged downward from a periphery edge of the circular top plate as having a similar length to a length of the leading portion 21a in the width direction. At the inside of the exposed negative electrode member 32, a conductive member may be arranged downward from an inner face of the circular top plate to be inserted to a gap between leading portions 21a at different turns so as to be in contact with the leading portions 21a. Not limited to be sheet-shaped, such a conductive member may be like a non-woven cloth or like a brush.

The wound roll 31 is covered at an end on the opposite side to the leading portions 21a with an exposed positive electrode member 33 (may be regarded as a lower cover) made of a conductive material to which an external positive electrode terminal is contacted. The exposed positive electrode member 33 includes a circular bottom plate and a cylinder member arranged upward from a periphery edge of the circular bottom plate as having a similar length to a length in the width direction of a portion lowered by the steps of the positive electrode layers 25F, 25R. At the inside of the exposed positive electrode member 33, a conductive member may be arranged upward from an inner face of the circular bottom plate to be inserted to a gap between lowered step portions of the positive electrode layers 25F, 25R at different turns so as to be in contact with the lowered step portions. Not limited to be sheet-shaped, such a conductive member may be like a non-woven cloth or like a brush.

Figure 8C:
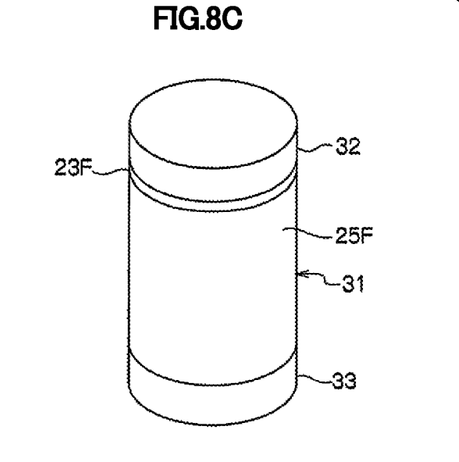
Figure 8D:
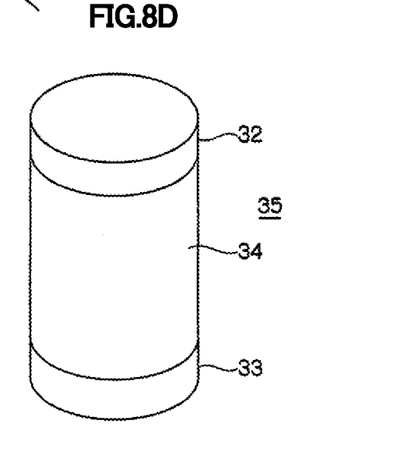

FIG. 8(C) illustrates a state that the exposed negative electrode member 32 and the exposed positive electrode member 33 are attached to the wound roll 31. Then, as illustrated in FIG. 8(D), the side face of the approximately cylindrical state is covered with a sheet-shaped insulating member 34. Thus, a secondary battery 35 to be used practically is completed.

In the abovementioned procedure, the sheet-shaped insulating member 34 is attached after the exposed negative electrode member 32 and the exposed positive electrode member 33 are attached. However, it is also possible to complete the secondary battery 35 with a procedure to attach the exposed negative electrode member 32 and the exposed positive electrode member 33 after the sheet-shaped insulating member 34 is attached.

In the above description, a single secondary cell 20 is wound. However, it is also possible to wind a plurality of secondary cells 20 in a layered state. Here, the secondary cells 20 may be layered as being shifted in the elongated direction while being matched in the width direction.

(A-4) Effects of Secondary Battery of First Embodiment

According to the secondary battery 20 of the first embodiment, following effects can be obtained.

The negative electrode includes the leading portion 21a designed to be in contact with an external electrode member (e.g., the exposed negative electrode member 32). Further, the positive electrode includes a portion to which an external electrode member (e.g., the exposed positive electrode member 33) formed while extending a film-forming region toward an end in the width direction. Accordingly, portions to be in contact with external electrode members can be formed thin and workload for the forming is less required.

When the roll-like mounting method is adopted, the positive electrodes 25F, 25R are wound into a roll shape to form a bar-shaped leading portion. Accordingly, it is possible to provide simple electrical connection at low resistance, so that losses during charging and discharging are reduced. Further, compared to a method to externally attach leading electrodes to the positive electrode and negative electrode, workload for manufacturing can be reduced.

Since the secondary battery 20 of the first embodiment includes a unit cell (unit secondary cell) on both the sides of the sheet-shaped negative-electrode-functioning base material 21, energy density can be increased. For example, compared to a secondary battery that is formed by two conventional secondary cells each being arranged on a base material (may be a negative-electrode-functioning base material, as well) kept remaining as it is to form unit cells on both sides with back faces of the base materials bonded, thickness of the base material in the secondary battery 20 of the first embodiment can be reduced to approximately half of the compared secondary battery. Accordingly, energy density can be increased.

In the secondary battery 20 of the first embodiment, two unit cells are parallel-connected while the sheet-shaped negative-electrode-functioning base material 21 is commonly used by the two unit cells. When physical quantities to be obtained with the secondary battery 20 of the first embodiment is supposed to be obtained with two separate unit cells, structural elements are required for parallel-connecting the two separate unit cells. Accordingly, a structure and manufacturing processes of the secondary battery 20 of the first embodiment are regarded as being simpler by the amount thereabove.

Manufacturing processes include a thermal treatment such as forming the charging layers 23F, 23R. Here, since the sheet-shaped negative-electrode-functioning base material 21 is covered with the n-type metal oxide semiconductor layers 22F, 22R on both faces in an early stage, problems such as oxidation during the thermal treatment become smaller compared to a conventional secondary battery.

In the secondary battery 20 of the first embodiment, the positive electrode layers 25F, 25R occupy most exposed part excepting for the leading portion 21a of the sheet-shaped negative-electrode-functioning base material 21. Accordingly, even when a plurality of secondary cells 20 are overlapped, even when one or a plurality of secondary cells 20 are wound or folded, contacting occurs only between the positive electrode layers. According to the above, a variety of mounting structures can be adopted without using an insulating member or the like.

(B) Other Embodiments

A variety of modified embodiments are described in the description of the first embodiment. In addition, modified embodiments described in the following may be adopted.

(B-1) In the first embodiment, the base material functions as a negative electrode as well. However, in reverse, it is also possible that the base material functions as a positive electrode as well. In this case, a p-type metal oxide semiconductor layer, a charging layer, an n-type metal oxide semiconductor layer, and a negative electrode layer are sequentially film-formed on a positive-electrode-functioning base material. Alternatively, a charging layer, an n-type metal oxide semiconductor layer, and a negative electrode layer are sequentially film-formed on a positive-electrode-functioning base material on which a p-type metal oxide semiconductor layer is formed in advance.

When a secondary cell of the first embodiment and a secondary cell of the modified embodiment are overlapped, serial connection of single-layer secondary cells is actualized and terminal voltage can be heightened.

(B-2) In the first embodiment, the negative-electrode-functioning base material being a base of the secondary cell is shaped as a rectangular sheet as having a large length difference between a short side and a long side. However, the negative-electrode-functioning base material is not limited to that in the first embodiment. For example, it is also possible to adopt a rectangular shape in which a longitudinal length is almost the same as a lateral length or another shape such as a circular shape and hexagonal shape. In a case that a circular shape or a hexagonal shape is adopted, it is preferable to add a part corresponding to a leading portion to a basic shape.

Further, for example, it is also possible to form a negative-electrode-functioning base material into a cylindrical shape and to arrange unit cells being similar to those in the first embodiment at both of an outer face and an inner face of the side face of the cylinder (a bottom face may be included if existing).

(B-3) In the first embodiment, a portion functioning as a leading portion 21a for the negative electrode is ensured respectively on both faces of the negative-electrode-functioning base material 21. However, it is also possible that a portion functioning as the leading portion 21a is not arranged on one face (e.g., rear face) to cause the whole rear face to function as a unit cell.

Further, in a case that the negative-electrode-functioning base material 21 is belt-shaped, it is possible to arrange a leading portion 21a at one end or both ends in the elongated direction without arranging a portion functioning as the leading portion 21a at both ends in the width direction.

(B-4) In the first embodiment, the leading portion 21a for the negative electrode is plate-shaped. However, not limited thereto, the leading portion 21a for the negative electrode may be, for example, comb-shaped or serration-shaped. Further, the leading portion 21a for the negative electrode may be formed with an opening to which a cylinder or a circular bar is fitted.

(B-5) In the first embodiment, the base material end face insulating portion 26 is formed positively with a thin-film forming process or the like. However, the base material end face insulating portion 26 may be formed with another method. For example, in a case that the sheet-shaped negative-electrode-functioning base material 21 is formed on a surface of an insulator by attaching a conductive thin film with sputtering or plating, the base material end face insulating portion 26 is arranged by preventing the conductive thin film from being attached to a region that is to be the base material end face insulating portion 26.

Figure 9A:
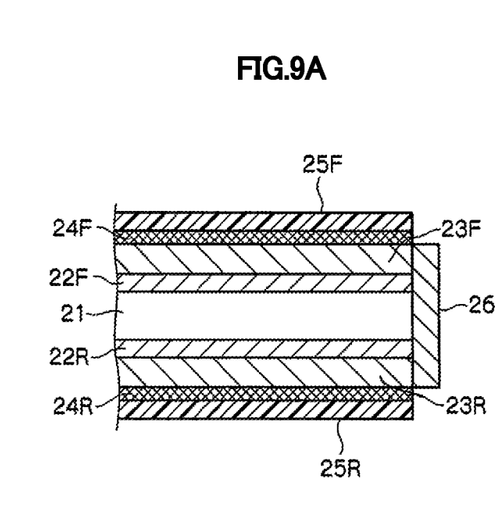
FIG. 9 is an explanatory view illustrating a modified embodiment of an end face insulating member of a secondary battery of the first embodiment.
Figure 9B:
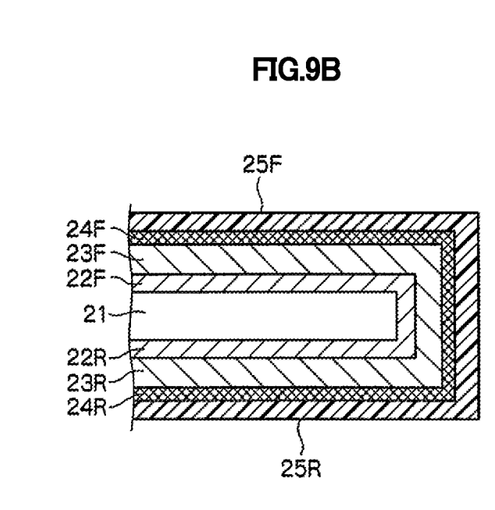

(B-6) In the first embodiment, the base material end face insulating portion 26 is formed to have a U-shaped section. However, the method of arranging the base material end face insulating portion 26 is not limited thereto. Further, as long as insulation between the positive electrode layer and the negative electrode layer can be ensured in the vicinity of the end face of the base material, the base material end face insulating portion 26 may not be arranged. FIG. 9(A) illustrates a case that a base material end face insulating portion 26 is arranged to cover only the end face of the sheet-shaped negative-electrode-functioning base material 21 without being arranged at the front side and the rear side of the sheet-shaped negative-electrode-functioning base material 21. FIG. 9(B) illustrates a case that the base material end face insulating portion 26 is caused to be unnecessary by arranging the n-type metal oxide semiconductor layer, the charging layer, the p-type metal oxide semiconductor layer, and the positive electrode layer at the end face of the sheet-shaped negative-electrode-functioning base material 21 as being continued from the front side to the rear side.

(B-7) The mounting structure of the secondary battery 20 of the first embodiment is not limited to the above. Followings are examples of the mounting structure other than the abovementioned wound roll type.

It is also possible that the secondary battery 20 is mounted after being folded in two at the center position in the elongated direction. Further, it is also possible that the secondary battery 20 is mounted into a case or the like after being folded in four obtained by folding the two-folded cell in the width direction so as not to cause short circuit between the positive electrode and the negative electrode. Further, it is also possible that the secondary battery 20 is mounted into a case or the like after being folded into an accordion shape with the folding direction changed alternately. Further, it is also possible that the secondary battery 20 is mounted into a case or the like after being folded into a cloth roll shape with the folding direction unchanged for each folding. In a case of folding into an accordion shape or a cloth roll shape, it is also possible that the folding is performed by using a slim cylinder or circular rod made of a conductive material that can be used as an electrode and that the cylinder or circular rod is caused to function to electrically connect the positive electrode layer and an external positive electrode member. Further, it is also possible to perform mounting after performing folding at a predetermined angle (e.g., 45 degrees) other than 90 degrees against the elongated direction to change a laying direction from the horizontal direction to another direction at some midpoint thereof. It is also possible to perform mounting in an endless state with both ends in the elongated direction of the secondary battery 20 connected physically (in an electrically connected state or an electrically isolated state). Here, it is also possible that tensional force is applied to such an endless-belt-shaped secondary cell with a plurality of slim cylinders or circular rods and that each cylinder or circular rod is caused, similarly to the above, to function to electrically connect the positive electrode layer and an external positive electrode member.

(B-8) In the mounting, it is also possible that an insulation sheet, an insulation plate, or the like is appropriately interposed. Further, a positive electrode connecting member that connects the positive electrode layers 25F, 25R and the exposed positive electrode member may be used in the mounting.

(B-9) In the first embodiment, the unit cell is structured as a quantum cell. However, not limited to a quantum cell, it is simply required to adopt a secondary cell having a sheet shape (parallel flat plate shape). For example, a solid-state lithium ion secondary cell may be adopted as a unit cell that is to be arranged on both sides of a negative-electrode-functioning base material or a positive-electrode-functioning base material.

The invention claimed is:

1. A secondary battery, comprising:
    a sheet-shaped first-electrode-functioning base material having a function as a first electrode and a function as a base material;
    a front-side charging layer formed on a front side of the first-electrode-functioning base material;
    a front-side second electrode layer layered on the front-side charging layer;
    a rear-side charging layer formed on a rear side of the first-electrode-functioning base material; and
    a rear-side second electrode layer layered on the rear-side charging layer,
    wherein the secondary battery further comprises a front-side first oxide semiconductor layer formed between the first-electrode-functioning base material and the front-side charging layer; and a rear-side first oxide semiconductor layer formed between the first-electrode-functioning base material and the rear-side charging layer,
    wherein the front-side charging layer, the rear-side charging layer, the front-side first oxide semiconductor layer, and the rear-side first oxide semiconductor layer are not formed at one end of the first-electrode-functioning base material,
    wherein an end face insulating portion is formed at the one end of the first-electrode-functioning base material where the front-side and rear-side charging layers and the front-side and rear-side first oxide semiconductor layers are not formed, to prevent a short circuit between the first-electrode functioning base material and the front-side and rear-side second electrode layers at the one end of the first-electrode-functioning base material, and
    wherein a thickness of the end face insulation portion at a front side and a rear side of the first-electrode-functioning base material is approximately the same as a thickness of the front-side first oxide semiconductor layer and the rear-side first oxide semiconductor layer.

2. The secondary battery according to claim 1, wherein each of the front-side charging layer and the rear-side charging layer is structured as a charging layer in which an oxide semiconductor causes photoexcited structural change as generating a number of electron-absent energy levels in a band gap so that charging is performed by causing electrons to be captured at the energy level and discharging is performed by causing captured electrons to be released, further comprising:
    a front-side second oxide semiconductor layer formed between the front-side charging layer and the front-side second electrode layer; and
    a rear-side second oxide semiconductor layer formed between the rear-side charging layer and the rear-side second electrode layer.

3. The secondary battery according to claim 1,
    wherein the front-side charging layer, the front-side second electrode layer, the rear-side charging layer and the rear-side second electrode layer are not formed in a region for connecting the first electrode with an external first electrode member.

4. The secondary battery according to claim 1, further comprising a base material end face insulating portion arranged at an end face of at least a part of the first-electrode-functioning base material to prevent short circuit of the front-side second electrode layer and the rear-side second electrode layer with the first electrode.

5. The secondary battery according to claim 2,
    wherein the front-side first oxide semiconductor layer and the rear-side first oxide semiconductor layer are n-type metal oxide semiconductors, and
    the front-side second oxide semiconductor layer and the rear-side second oxide semiconductor layer are p-type metal oxide semiconductors.

6. The secondary battery according to claim 2,
    wherein the front-side first oxide semiconductor layer and the rear-side first oxide semiconductor layer are p-type metal oxide semiconductors, and
    the front-side second oxide semiconductor layer and the rear-side second oxide semiconductor layer are n-type metal oxide semiconductors.

7. The secondary battery according to claim 2,
    wherein the front-side charging layer, the front-side second electrode layer, the rear-side charging layer and the rear-side second electrode layer are not formed in a region for connecting the first electrode with an external first electrode member.

8. The secondary battery according to claim 2, further comprising a base material end face insulating portion arranged at an end face of at least a part of the first-electrode-functioning base material to prevent short circuit of the front-side second electrode layer and the rear-side second electrode layer with the first electrode.

* * * * *